United States Patent [19]

Shiokawa

[11] Patent Number: 4,639,597
[45] Date of Patent: Jan. 27, 1987

[54] AUGER ELECTRON SPECTROMETER CAPABLE OF ATTAINING A HIGH RESOLUTION

[75] Inventor: Yoshiro Shiokawa, Tokyo, Japan
[73] Assignee: Anelva Corporation, Japan
[21] Appl. No.: 663,855
[22] Filed: Oct. 23, 1984
[30] Foreign Application Priority Data Oct. 24, 1983 [JP] Japan .................. 58-197546

[51] Int. Cl.⁴ ............................ H01J 37/252
[52] U.S. Cl. ................ 250/305; 250/396 ML
[58] Field of Search ............. 250/305, 310, 396 ML, 250/396 R, 309, 311

[56] References Cited

U.S. PATENT DOCUMENTS

| | | | |
|---|---|---|---|
| 2,305,761 | 12/1942 | Borries et al. | 250/396 |
| 2,503,173 | 4/1950 | Reisner | 250/396 ML |
| 3,100,260 | 8/1963 | Wilska | 250/396 ML |
| 3,707,628 | 12/1972 | Bassett et al. | 250/396 ML |
| 4,117,322 | 9/1978 | McKinney | 250/309 |
| 4,205,226 | 5/1980 | Gerlach | 250/305 |
| 4,224,518 | 9/1980 | Taylor | 250/305 |
| 4,562,352 | 12/1986 | Shiokawa | 250/305 |

*Primary Examiner*—Bruce C. Anderson
*Assistant Examiner*—Paul A. Guss
*Attorney, Agent, or Firm*—Laff, Whitesel, Conte & Saret

[57] ABSTRACT

In an Auger electron spectrometer for use in analyzing a surface of an object by the use of Auger electrons resulting from impingement of an electron beam, an electron gun comprises an electron beam source for generating the electron beam and an electron lens system for guiding the electron beam towards the surface. The electron lens system comprises a combination of a condenser lens and a permanent magnet member nearer to the surface than the condenser lens. The permanent magnet member may comprise either a plurality of permanent magnet pieces radially and azimuthally spaced apart from one another or a single permanent magnet piece. An ion gun may be disposed in the vicinity of the electron gun to generate an ion beam oblique to the electron beam and substantially concurrent with the electron beam on the surface. Magnetic pole pieces may be attached to each permanent magnet piece and bypassed to control a magnetic field generated by each permanent magnet piece. Each permanent magnet piece may be coated with a combination of a nonmagnetic film and a magnetic film. Anyway, the electron gun can be disposed in an inner cylindrical space of an inner cylindrical electrode member when the electron spectrometer is of a cylindrical mirror type.

11 Claims, 12 Drawing Figures

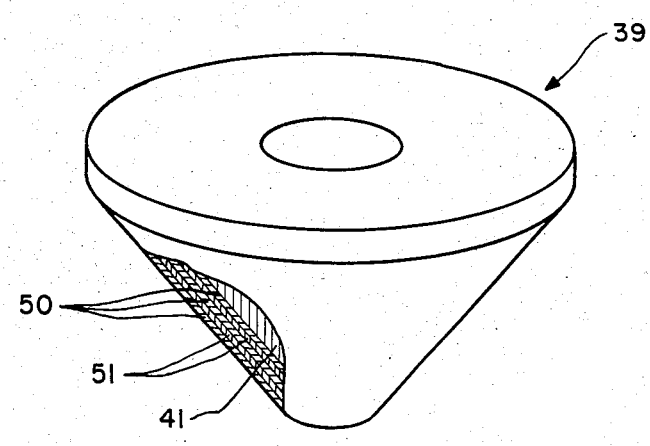
FIG. 10
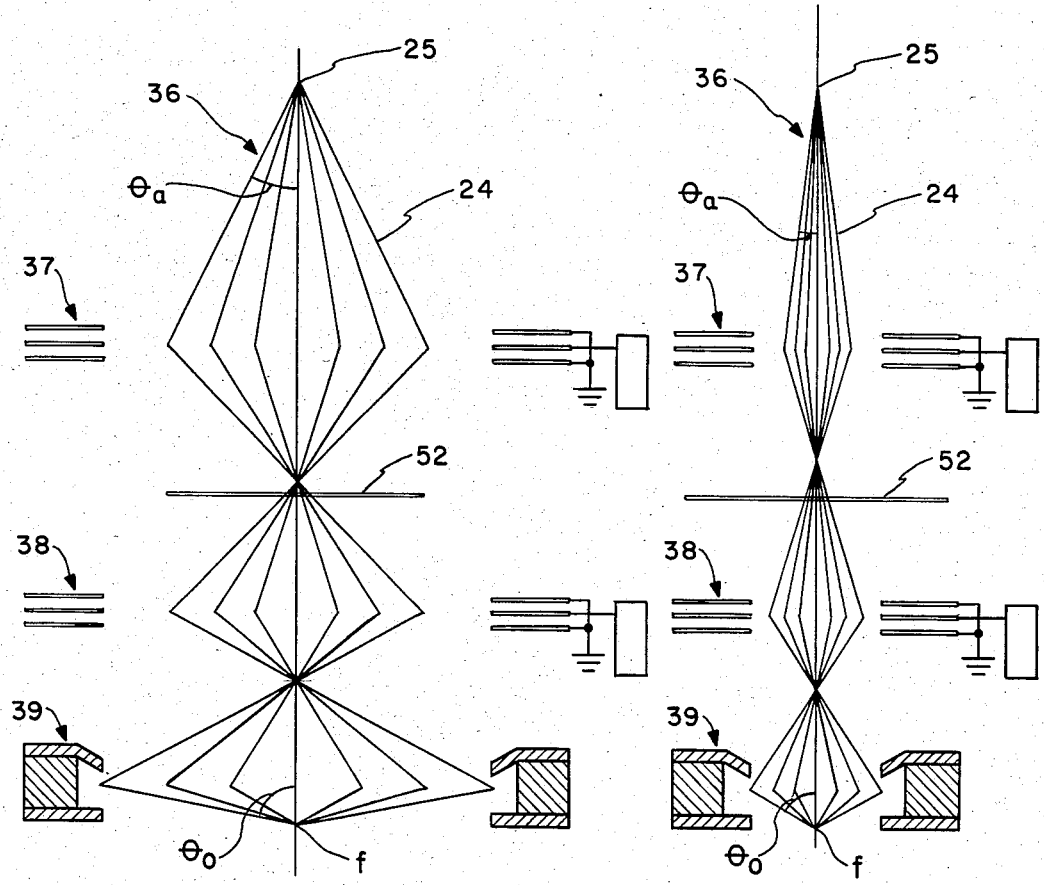
FIG. 11
FIG. 12

AUGER ELECTRON SPECTROMETER CAPABLE OF ATTAINING A HIGH RESOLUTION

BACKGROUND OF THE INVENTION

This invention relates to an Auger electron spectrometer for analyzing a surface of an object by Auger electrons known in the art. More particularly, this invention is applicable to an electron gun for use in the Auger electron spectrometer so as to radiate an electron beam onto the surface.

In general, the electron gun has an electron gun axis extended to the surface and comprises an electron beam source for generating the electron beam along the electron gun axis and an electron lens system between the electron beam source and the surface on which the electron beam is incident along the electron gun axis.

In a conventional Auger electron spectrometer, the electron lens system comprises either only electrostatic lenses or only electromagnetic lenses. The electromagnetic lenses comprise coils which are often called coil excited electron lenses. When the electron gun comprises only the electrostatic lenses, the electron beam has a wide diameter on the surface because each electrostatic lens has a large spherical aberration. This adversely affects resolution of the analysis. When the electron gun comprises only the coil excited electron lenses, the electron beam also has a wide diameter on the surface because the coil excited electron lenses have a very large overall size. Furthermore, it is impossible to achieve a sufficiently low pressure for analysis because the coil excited electron lenses release a large amount of gas. The coil excited electron lenses have a considerably strong leakage magnetic field because each coil excited electron lens comprises a coil and/or a magnetic pole piece of a large size.

SUMMARY OF THE INVENTION

It is an object of this invention to provide an Auger electron spectrometer which is capable of attaining a high resolution of analysis of a surface of an object to be analyzed.

It is another object of this invention to provide an Auger electron spectrometer wherein an electron beam has a narrow diameter on the surface.

It is a further object of this invention to provide an Auger electron spectrometer of the type described, which provides a sufficiently low pressure.

It is a still further object of this invention to provide an Auger electron spectrometer of the type described, wherein a leakage magnetic field is small.

An Auger electron spectrometer to which this invention is applicable comprises an electron gun for radiating an electron beam onto a surface of an object to make the surface emit Auger electrons and an electron spectroscope for detecting and analyzing the Auger electrons. The electron gun has an electron gun axis extended to the surface, an electron beam source for generating the electron beam along the electron gun axis, and an electron lens system between the electron beam source and the surface for guiding the electron beam towards the surface along the electron gun axis. According to this invention, the electron lens system comprises controllable electrostatic lens means adjacent to the electron beam source for controllably focusing the electron beam into a controllable processed beam and a permanent magnet member nearer to the surface than the electrostatic lens means for generating a magnetic field to focus the processed beam onto the surface.

According to an aspect of this invention, the Auger electron spectrometer further comprises an ion gun for radiating an ion beam onto the surface along an ion gun axis. The ion gun axis is oblique to and substantially concurrent with the electron gun axis on the surface. The permanent magnet member comprises a permanent magnet element having an internal wall surrounding an internal space for the processed beam and for the ion beam.

BRIEF DESCRIPTION OF THE DRAWING

FIG. 10 is a perspective view, partly in section, of a permanent magnet excited electron lens of an Auger electron spectrometer according to a fifth embodiment of this invention;

FIG. 11 is a schematic illustration of an electron gun of an Auger electron spectrometer according to a sixth embodiment of this invention; and FIG. 12 is another schematic illustration of the electron gun depicted in FIG. 11.

DESCRIPTION OF THE PREFERRED EMBODIMENTS

Figure 1:
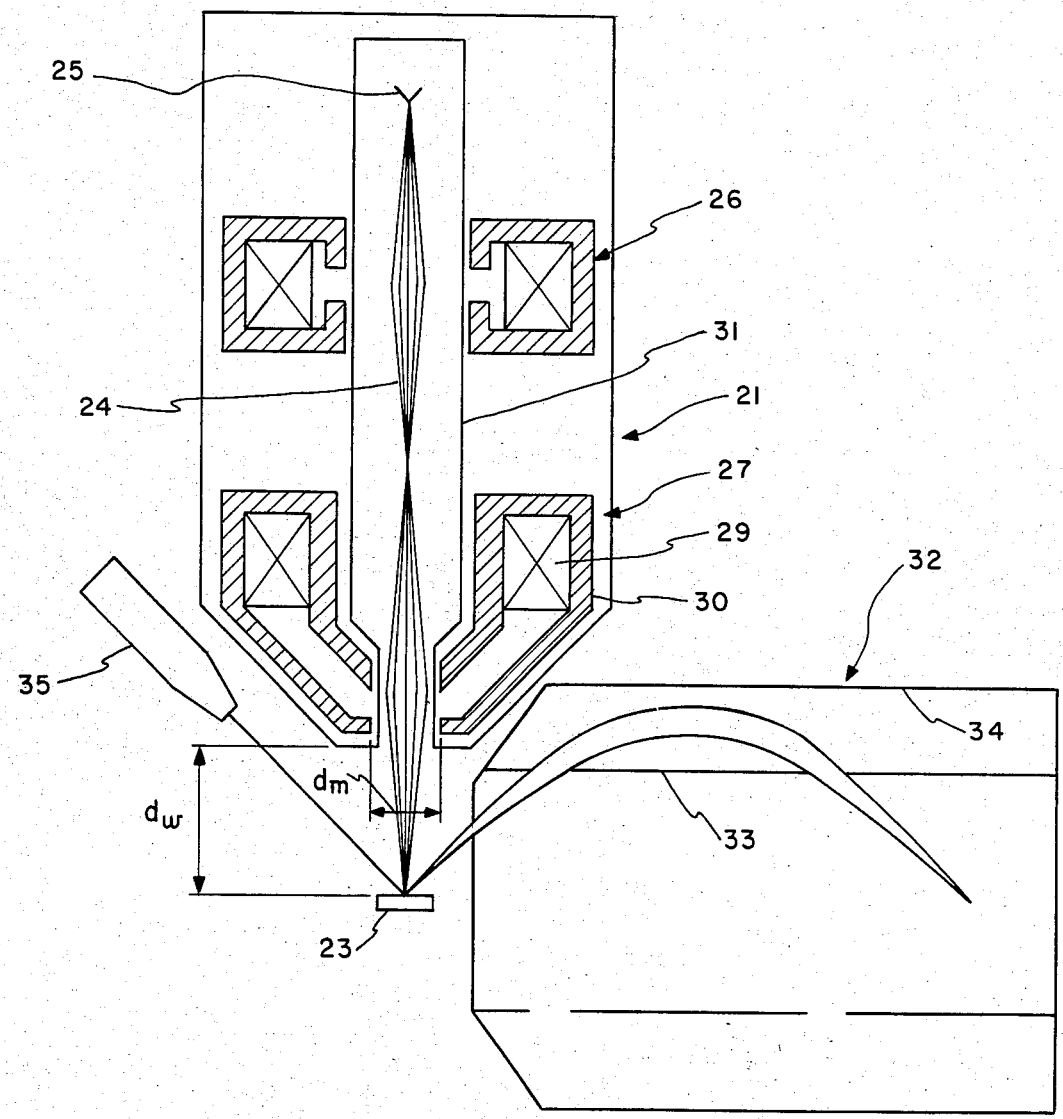
FIG. 1 is a schematic vertical sectional view of a conventional Auger electron spectrometer.

Referring to FIG. 1, a conventional Auger electron spectrometer will be described at first in order to facilitate an understanding of the present invention. The Auger electron spectrometer comprises an electron gun 21. The electron gun 21 has an electron gun axis. An object 23 has a surface transversely of the electron gun axis. The electron gun 21 is for radiating an electron beam 24 onto the surface of the object 23 to make the surface emit Auger electrons known in the art.

The electron gun 21 comprises an electron beam source 25 for generating the electron beam 24 along the electron gun axis and an electron lens system between the electron beam source 25 and the surface as will presently be described. The electron lens system is for guiding the electron beam 24 towards the surface along the electron gun axis.

The electron lens system comprises a first coil excited electron lens 26 adjacent to the electron beam source 25. The first coil excited electron lens 26 is for generating a magnetic field for use in focusing the electron beam 24 into a controllably processed beam. A second coil excited electron lens 27 is disposed nearer to the surface than the first coil excited electron lens 26. The second coil excited lens 27 is for generating another magnetic field to focus the processed beam onto the surface. Each of the coil excited electron lenses 26 and 27 comprises a coil 29 and a magnetic pole piece 30 and are surrounded by a vacuum wall 31 for the coil excited electron lenses 26 and 27.

A cylindrical mirror type analyzer 32 comprises inner and outer coaxial cylindrical electrode members 33 and 34 having a common cylinder axis. The inner cylindrical electrode member 33 defines an inner cylindrical space. The outer cylindrical electrode member 34 surrounds the inner cylindrical space with an intermediate space left between the inner and the outer cylindrical electrode members 33 and 34. The cylindrical mirror type analyzer 32 is for detecting and analyzing the Auger electrons. The cylindrical mirror type analyzer 32 is therefore operable as an electron spectroscope.

An ion gun 35 has an ion gun axis and radiates an ion beam onto the surface of the object 23 to etch the surface. The ion gun axis is oblique to the electron gun axis and substantially concurrent with the electron gun axis on the surface.

The electron gun 21, the cylindrical mirror type analyzer 32, and the ion gun 35 are housed in a vacuum vessel (not shown) of the Auger electron spectrometer. The electron gun 21 and the ion gun 35 are disposed outwardly of the analyzer 32.

This structure is disadvantageous in the following respects.

In the first place, the coil 29 has a very wide surface area and releases a large amount of gas. Consequently, the coil 29 must be placed in the atmosphere and can not be placed in the vacuum because the Auger electron spectrometer is used in an ultrahigh vacuum. Therefore, all or a part of the coil 29 or the magnetic pole piece 30 must be surrounded by the vacuum wall 31 or be molded with resin. The coil 29 must have a strong exciting force because the magnetic pole piece 30 has a long gap $d_m$. As a result, the coil excited electron lenses have a very large overall size. This cause a very serious trouble as will be described hereinunder because the electron spectroscope 32 and the ion gun 35 must be placed in the Auger electron spectrometer near the object 23. That is, a distance between an end of the electron gun 21 and the object 23, which is often called a working or operating distance $d_w$, is very long. The longer operating distance $d_w$ results in a spherical aberration. Therefore, the electron beam 24 has a wide diameter on the surface.

In the second place, the coil 29 and the vacuum wall 31 render it difficult to achieve the ultrahigh vacuum in the vacuum vessel of the Auger electron spectrometer. It is true that the coil 29 is placed in the atmosphere. The coil 29 is, however, liable to damage when heated because the coil 29 is molded by the resin. It is therefore objectionable for degassing to sufficiently raise the temperature of the vacuum wall 31 to which the coil 29 is adjacent. Moreover, the vacuum wall 31 has a complex shape sealed by a large number of elastomeric seals. This additionally makes it difficult to achieve a sufficiently low pressure for analysis.

In the third place, it is impossible to perfectly carry out magnetic shielding of the coil 29 because the exciting force is strong. Furthermore, the coil 29 and the magnetic pole piece 30 have a large size. Therefore, the Auger electron is deflected by a considerably strong leakage magnetic field which is inevitable near the object 23. This often causes a bad influence to spectrum. In particular, the leakage magnetic field is fatal to measurement of Auger electron of low energy.

First Embodiment

Figure 2:
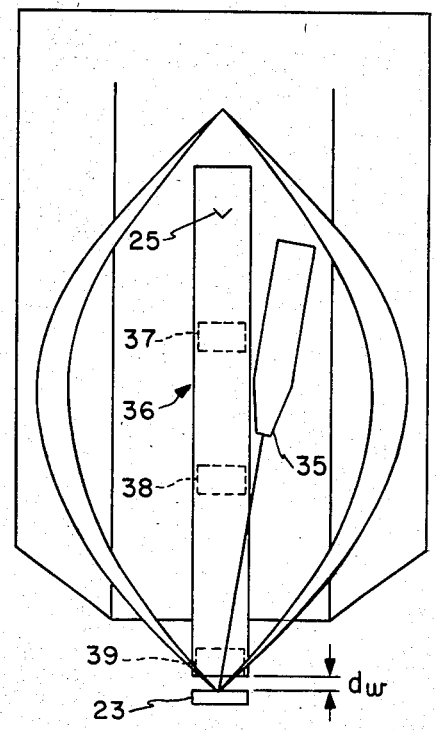
FIG. 2 is a vertical sectional view of an Auger electron spectrometer according to a first embodiment of this invention.

Referring to FIG. 2, an Auger electron spectrometer according to a first embodiment of this invention comprises similar parts designated by like reference numerals. In the Auger electron spectrometer being illustrated, a novel electron gun 36 is disposed in the inner cylindrical space with the electron gun axis rendered coincident with the common cylinder axis.

An electron lens system for use in the electron gun 36 comprises a first electrostatic lens 37 adjacent to the electron beam source 25. The first electrostatic lens 37 is for generating an electric field for use in preliminarily focusing the electron beam to allow the electron beam to pass therethrough along the electron gun axis. A second electrostatic lens 38 is disposed further from the electron beam source 25 than the first electrostatic lens 37. The second electrostatic lens 38 is for generating another electric field for use in additionally focusing the electron beam to produce a processed beam. The first and the second electrostatic lenses 37 and 38 are therefore operable as a condenser lens.

Further, the electron lens system comprises a permanent magnet excited electron lens 39 which is disposed nearer to the surface than the second electrostatic lens 38. The permanent magnet excited electron lens 39 is for generating a magnetic field to focus the processed beam onto the surface. The permanent magnet excited electron lens 39 is therefore operable as an objective lens.

An ion gun 35 is disposed in the inner cylindrical space with the ion gun axis rendered noncoincident with the common cylinder axis. The ion gun 35 is for radiating an ion beam onto the surface along the ion gun axis.

Figure 3:
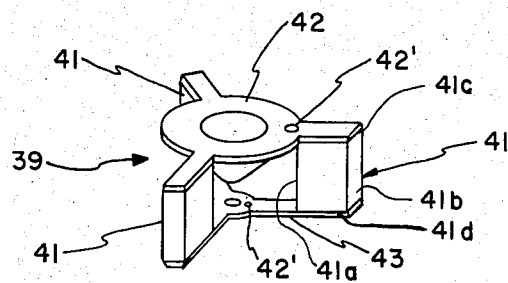
FIG. 3 is a perspective view of a permanent magnet excited electron lens for use in the electron gun of the Auger electron spectrometer shown in FIG. 2.
Figure 4:
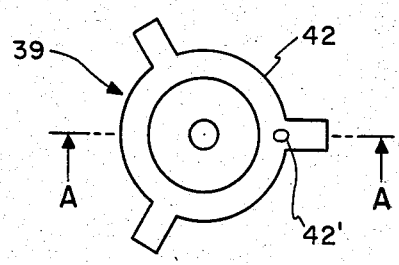
FIG. 4 is a top view of the permanent magnet excited electron lens.
Figure 5:
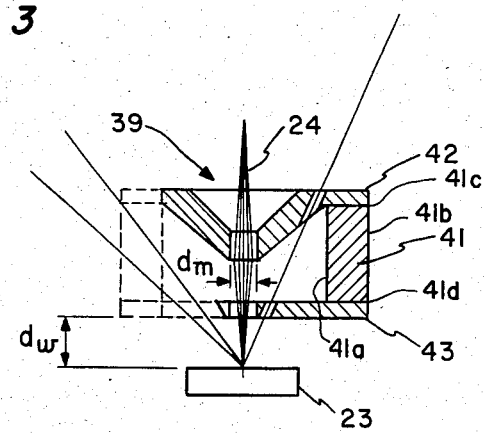
FIG. 5 is an axial sectional view of the permanent magnet excited electron beam.

Referring to FIGS. 3 through 5, the permanent magnet excited electron lens 39 comprises a plurality of permanent magnet pieces, each indicated at 41. Each of the permanent magnet pieces 41 serves to define an internal wall 41a surrounding an internal space for the processed beam and for the ion beam.

Each of the permanent magnet pieces 41 has an outer wall 41b opposite to the internal wall 41a, a first end wall 41c between the internal and the outer walls 41a and 41b and directed towards the second electrostatic lens 38, and a second end wall 41d opposite to the first end wall 41c and between the internal and the outer walls 41a and 41b. A first magnetic pole piece 42 has a first opening formed therethrough and brought into contact with the first end wall 41c with the first opening in communication with the internal space. A second magnetic pole piece 43 has a second opening formed therethrough and brought into contact with the second end wall 41d with the second opening in communication with the internal space. The internal space and the first and second openings enable the processed beam to pass therethrough.

With this structure, a number of improvements can be accomplished by the Auger electron spectrometer being illustrated, as will be described hereinunder.

At first, the vacuum wall 31 and the molded coil 29 are not used in the illustrated Auger electron spectrometer because the permanent magnet excited electron lens 39 is placed in the vacuum. Therefore, the electron gun 36 has a very simple structure. Furthermore, the electron gun 36 can be operated by a weak exciting force because the magnetic pole pieces 42 and 43 have a short gap $d_m$ (FIG. 5) therebetween.

It is important for the Auger electron spectroscope that heat is not generated therein. Under the circumstances, the permanent excited electron lens 39 is capable of producing a predetermined exciting force in reduced size in comparison with the coil excited electron lens. The first and the second electrostatic lenses 37 and 38 can also be small. Therefore, the electron gun 36 is much smaller than the conventional electron gun 21. It is possible to effectively use the limited space in the vacuum vessel and to render the operating distance $d_w$ short. Together with a small spherical aberration attained by the permanent magnet excited electron lens 39, the electron beam has a very narrow diameter on the surface of the object 23.

Secondly, the permanent magnet pieces 41 are capable of withstanding a relatively high temperature of 200° or 300° C. The structure is simple. It is therefore possible to sufficiently bake the structure for degassing and to achieve a sufficiently high vacuum for analysis.

Thirdly, it is possible to sufficiently carry out the magnetic shield and to avoid adverse influences to the spectrum. This is because it is possible to use weak permanent magnet pieces 41 and to reduce the sizes of the permanent magnet pieces 41 and the magnetic pole pieces 42 and 43.

Fourthly, the Auger electrons can be collected from whichever parts around the common cylinder axis. This is because the electron gun 36 is disposed in the inner cylindrical space and the common cylinder axis is at right angle to the surface of the object 23. Therefore, it is possible to obtain high resolution even if the object 23 has a rugged surface. If the coil excited electron lens were placed in the inner cylindrical space, the structure would be extremely complex and would cause a serious influence to the spectrum. This is because the cylindrical mirror type analyzer 32 is very highly efficient and is very sensitive to the leakage magnetic field. Contrary to this, the permanent magnetic excited electron lens 39 can be easily placed in the inner cylindrical space because the lens 39 has a small overall size and a weak leakage magnetic field.

Fifthly, the permanent magnet pieces 41 are azimuthally spaced in the permanent magnet excited electron lens 39 in the manner described above. The permanent magnet pieces 41 therefore define a plurality of azimuthal spaces therebetween. The azimuthal spaces allow the Auger electrons to pass therethrough and enable the object 23 to be brought near to the permanent magnet excited electron lens 39, thereby rendering the operating distance $d_w$ (FIGS. 2 and 5) short substantially regardless of paths which the Auger electrons have. The short operating distance $d_w$ enables the electron beam to have a narrow diameter on the surface of the object. Incidentally, the permanent magnet pieces 41 are not necessarily placed in circular symmetry as a whole and may be placed in circular symmetry merely adjacent to the internal space. It is desirable that each of the permanent magnet pieces 41 has a short width when viewed from the object 23. It is to be noted that the cylindrical mirror type analyzer 32 has a plurality of beams near the position at which the Auger electrons are detected. The permanent magnet pieces 41 are preferably directed in coincidence with the directions from an axis of the analyzer 32 to the respective beams so that the Auger electron is detected efficiently.

Sixthly, the Auger electron spectrometer illustrated with reference to FIGS. 2 through 5 can reduce the angle between the electron beam and the ion beam because the ion beam can pass through the permanent magnet excited electron lens 39 as will presently be described. It is therefore possible to obtain high resolution in the direction of depth of the object 23. It is general that the object 23 has a rugged surface having a lot of projections and recesses. When a large angle is formed between a normal angle of the rugged surface and the ion beam, the projection of the object 23 throws a lot of shadows onto the recesses on radiation of the ion beam. This results in a reduction in the resolution of analysis defined in the direction of the depth of the object 23. It is therefore desirable that an angle between the electron beam 24 and the ion beam is small. In order to make the ion beam be incident nearly perpendicularly onto the surface of the object, the first magnetic pole piece 41 has a hole 42' for the ion beam depicted by a thick solid line in FIG. 5. One of the permanent magnet pieces 41 may have an extension of the hole 42'. Incidentally, the magnetic field causes a very small action on the ion beam because the ions have a large mass. It is therefore possible to reduce the angle between the electron beam 24 and the ion beam.

Figure 6:
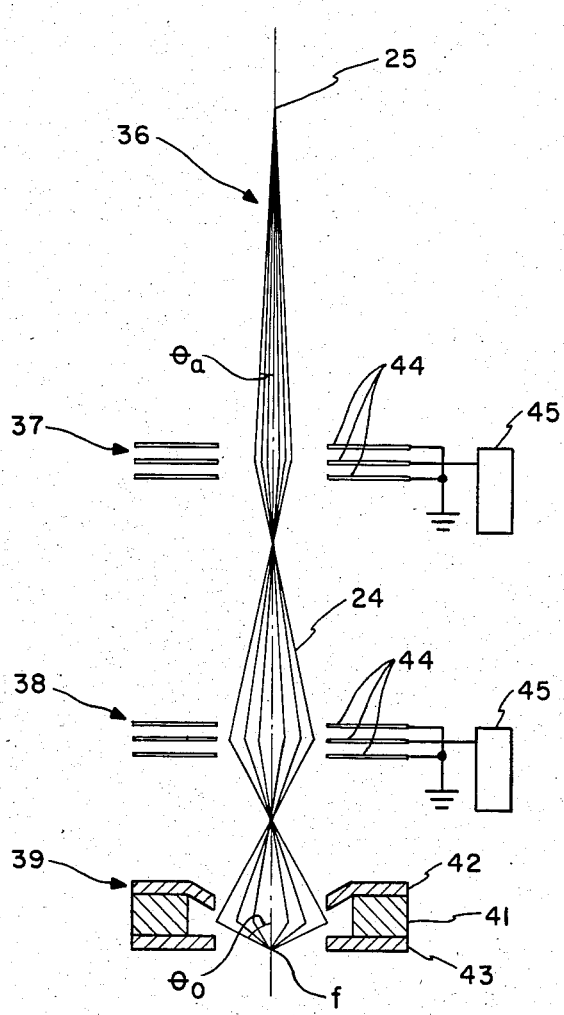
FIG. 6 is a view for use in describing operation of the electron gun shown in FIG. 2.

Referring to FIG. 6, operation will be described hereinunder for the electron gun 36. In this figure, f is a focus on the object 23 (FIGS. 2 and 5); $\theta_o$, an aperture or object angle; $\theta_a$, an acceptance angle; 44, electrostatic electrodes of the first and the second electrostatic lenses 37 and 38; and 45, variable voltage sources.

The electron beam 24 is generated from the electron beam source 25 and has the energy of several thousands of electron volts. The electron beam 24 is focused by the lenses 37 through 39 and has a narrow diameter at the focus f. The electron beam 24 is subjected to a focusing force by the electric fields in the lenses 37 and 38 and by the magnetic field in the lens 39. It is possible to change a focal length of the lenses 37 and 38 by the variable voltage source 45. On the other hand, the lens 39 has a fixed focal length. Despite the fixed focal length, it is possible to change the position of the focus f by adjusting the focal length of the lens 38. That is, the adjustment of focus f of the beam 24 is performed by the lens 38. The lens 37 defines an amount of beam current by changing the acceptance angle $\theta_a$.

The electron gun 36 has a very small spherical aberration because the magnetic lens 39 is used as the objective lens. It is to be noted that the lenses 37 and 38 have an appreciable spherical aberration because the lenses 37 and 38 are the electrostatic lenses. It is, however, known in optics that the spherical aberration becomes negligible for the electron beam 24 of a very small aperture or object angle $\theta_a$.

It is undesirable in the electron gun 36 to use a high accelerating voltage for the electron beam 24 because the magnetic field is fixed. It is, however, to be noted that the Auger electron spectrometer has a best detection sensitivity when the accelerating voltage is in the region of 3 to 5 kV. Beyond this region, not only the detection sensitivity is bad but also the object may be damaged.

Second Embodiment

Figure 7:
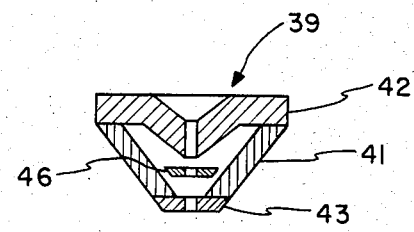
FIG. 7 is a vertical sectional view of a permanent magnet excited electron lens of an Auger electron spectrometer according to a second embodiment of this invention.

Referring to FIG. 7, another permanent magnet excited electron lens 39 is for use in an Auger electron spectrometer according to a second embodiment of this invention and comprises similar parts designated by like reference numerals. The permanent magnet excited electron lens 39 comprise a single permanent magnet piece which is again designated by the reference numeral 41. The permanent magnet piece 41 is of frustoconical shape and has an inner peripheral surface surrounding an internal space, an outer peripheral surface opposite to the inner surface, a first end surface between the inner and the outer surfaces and directed towards the second electrostatic lens 38, and a second end surface opposite to the first end surface and between the inner and the outer surfaces. The second end surface has a narrower area than the first end surface. The narrower area allows the Auger electrons to pass outside the outer peripheral surface and enables the object 23 to be brought near to the permanent magnet excited electron lens 39.

The first magnetic pole piece 42 has a first opening formed therethrough and brought into contact with the first end surface with the first opening in communication with the internal space. The second magnetic pole piece 43 has a second opening formed therethrough and brought into contact with the second end surface with the second opening in communication with the internal space. The internal space and the first and the second openings are for passage therethrough of the processed beam.

The permanent magnet excited electron lens 41 being illustrated further comprises a ring-shaped electrode 46. The ring-shaped electrode 46 is placed in the internal space between the first and the second magnetic pole pieces 42 and 43. The ring-shaped electrode 46 is for generating an electric field to control the magnetic field and defines a hole for the processed beam. The two magnetic pole pieces 42 and 43 and the ring-shaped electrode 46 are operable collectively as an electrostatic lens which has a freely variable focal length. More particularly, the two magnetic pole pieces 42 and 43 are necessarily given a common voltage. The ring-shaped electrode 46 is given an electric voltage which is different from the common voltage and is adjustable relative to the common voltage so as to change the focal length of the electrostatic lens. Combined with the magnet excited electron lens 39, the ring-shaped electrode 46 provides means for precisely adjusting the focus f (FIG. 6) for a variation in the accelerating voltage for the electron beam 24 (FIGS. 2 and 6).

Third Embodiment

Figure 8:
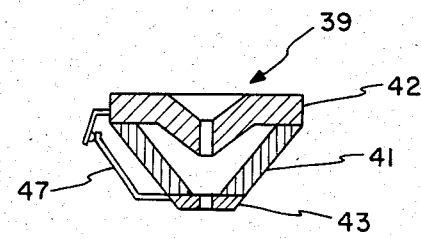
FIG. 8 is a vertical sectional view of a permanent magnet excited electron lens of an Auger electron spectrometer according to a third embodiment of this invention.

Referring to FIG. 8, a further permanent magnet excited electron lens 39 is for use in an Auger electron spectrometer according to a third embodiment of this invention comprises similar parts which are designated again by like reference numerals. The permanent magnet excited electron lens 39 being illustrated, further comprises a magnetically shorting unit 47 connected to the first and the second magnetic pole pieces 42 and 43. The shorting unit 47 comprises a pair of rods of a ferromagnetic material. The rods have ends fixed to the first and the second magnetic pole pieces 42 and 43 and have a gap between free ends thereof. The free ends are led to a pair of contacts (not shown). Like a relay switch, the contacts are controllably closed and open by mechanical force, magnetism, electricity, heat, or the like.

With this structure, it is possible to change the focal length by the closure and opening of the contacts. It is thereby possible to finely adjust the focal length of the electron gun 36 (FIGS. 2 and 6).

Fourth Embodiment

Figure 9:
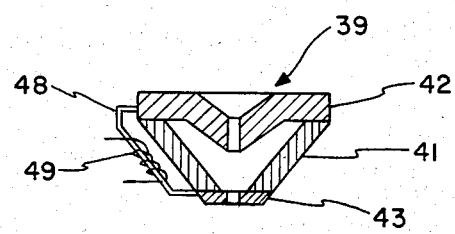
FIG. 9 is a vertical sectional view of a permanent magnet excited electron lens of an Auger electron spectrometer according to a fourth embodiment of this invention.

Referring to FIG. 9, a still further permanent magnet excited electron lens 39 is for use in an Auger electron spectrometer according to a fourth embodiment of this invention and comprises similar parts designated by like reference numerals. The magnet excited electron lens 39 comprises a magnetically shorting unit which comprises a single rod 48 interconnecting the first and the second magnetic pole pieces 42 and 43. The single rod 48 is made of a soft magnetic material. A coil 49 is wound around the rod 48 and is for controllably changing the magnetic flux density in the magnetic rod 48. In contrast to the shorting unit 47 described in conjunction with FIG. 8, the shorting unit being illustrated is capable of continuously adjusting the focal length.

Fifth Embodiment

Referring to FIG. 10, a yet further permanent magnet excited lens 39 is for use in an Auger electron spectrometer according to a fifth embodiment of this invention and comprises similar parts designated by like reference numerals. The permanent magnet excited electron lens 39 further comprises a stacked or laminated layer on the center peripheral surface. The stacked layer comprises an alternating stack of nonmagnetic films 50 and magnetic films 51 successively plated on the peripheral surface with one of the nonmagnetic films 50 in direct contact with the permanent magnet 41.

Generally, a magnetic field generating source is magnetically shielded by a magnetic layer in order to reduce the leakage magnetic field. Moreover, the magnetic field generating source is more perfectly magnetically shielded by a plurality of the magnetic layers between which at least one nonmagnetic layer is interposed. When the magnetic shield has a predetermined thickness, it is known that a plurality of the magnetic layer gives a higher shielding effect than a single magnetic layer. However, it is impossible to apply above-mentioned magnetic shield to the permanent magnet excited electron lens 39 because the permanent magnet excited electron lens 40 has a small overall size and a frustoconical outer peripheral surface.

In FIG. 10, the permanent magnet excited electron lens 39 is magnetically shielded without appreciably changing the size and the shape. For example, the nonmagnetic film 50 is formed by plating the outer peripheral surface with copper to a thickness of about several tens of micrometers. The magnetic film 51 is formed on the copper layer 50 by plating either iron or nickel to a thickness of about several tens of micrometers. The plating is repeated several times. It is thereby possible to completely magnetically shield the permanent magnet 41 with the stack which is only about one or two millimeters thick. If desired, it is possible to use a mask for partial removal of the plating.

Sixth Embodiment

Referring to FIGS. 11 and 12, an electron gun 36 is for use in an Auger electron spectrometer according to a sixth embodiment of this invention and comprises similar parts which are designated once again by like reference numerals. In FIGS. 11 and 12, the electrons are spread in the electron beam 24 from the electron beam source 25 in a wide region. Only a part of the electrons reaches the object 23 (not shown). The acceptance angle $\theta_a$ is an angle of the electrons of the electron beam 24 which reach the object 23 while the object angle $\theta_o$ is an angle of the electrons which are incident onto the object 23.

It is known in the art that the Auger electron spectrometer has a sensitivity which is proportional to an amount of an electric current, namely, the electrons incident onto the object 23. Inasmuch as the amount of electron current is determined by the acceptance angle $\theta_a$ (FIGS. 11 and 12) of electrons radiated from the electron beam source 25, the sensitivity rises with an increase of the acceptance angle $\theta_a$. On the other hand, it is preferable as regards spatial resolution that the electrons should form an image on the object 23 in as small a size as possible. The size of the image is dependent on a reduction ratio which is defined by a reciprocal of magnification and which is represented by a ratio of the acceptance angle to the object angle ($\theta_a/\theta_o$). In FIGS. 11 and 12, the reduction ratio may be, for example, 1/10 and 1/100, respectively. The size of the image is reduced in proportion to a cube of the object angle $\theta_o$.

In a conventional method, an aperture member is disposed between the electron beam source 25 and the electrostatic lens 37. The aperture member has been adjusted so as to have a certain aperture size and to control the sensitivity and the spatial resolution.

In FIGS. 11 and 12, it is to be noted that an aperture member 52 is disposed between the electrostatic lenses 37 and 38 and defines an aperture of a predetermined size. With this structure, the aperture of the aperture member is not changed in size to vary the sensivity and the spatial resolution. More particularly, the illustrated electron gun 36 uses the electrostatic lens 37 of a variable focal length.

In FIG. 11, the electrostatic lens 37 is controlled so that the focal length of the electrostatic lens 37 becomes long. In this event, the sensitivity becomes high because the acceptance angle $\theta_a$ is widened. Despite the high sensitivity, the spatial resolution is lowered because the reduction ratio is as high as 1/10 and the object angle $\theta_o$ becomes large. In FIG. 12, the electrostatic lens 37 is controlled so that the focal length of the electrostatic lens 37 becomes short. As a result, the spatial resolution becomes high because the reduction ratio is reduced to about 1/100 and the object angle $\theta_o$ becomes small. On the other hand, the sensitivity is lowered as compared with FIG. 11. Thus, the object angle $\theta_o$ is changed in dependency on the reduction ratio by changing the focal length of the electrostatic lens 37.

While the present invention has thus far been described in conjunction with several embodiments thereof, it will now be readily possible for those skilled in the art to practice this invention in various other manners. For example, a single permanent magnet may be substituted in FIGS. 3 through 5 for the plurality of permanent magnets 41. The Auger electron spectrometer may be of a double-pass cylindrical mirror type analyzer, a hemisphere type, or a band-pass type. The permanent magnet members as illustrated in FIGS. 3, 7, 8, 9, and 10 may be combined with one another. The electron beam source 25 may either be of a hot cathode type or a cold cathode type. Each of the electrostatic lenses 37 and 38 may be of a cylindrical lens type, Butler type, or the like instead of three-electrode type illustrated in FIG. 6. The Auger electron spectrometer may be combined with the other analyzing apparatus for analyzing a surface of an object such as 23. The other analyzing apparatus may be an electron spectrometer for chemical analysis (ESCA), a secondary ion mass spectrometer (SIMS), an ion scattering spectrometer (ISS), or the like.

What is claimed is:

1. In an Auger electron spectrometer comprising an electron gun for radiating an electron beam onto a surface of an object to make the surface emit Auger electrons and an electron spectroscope for detecting and analyzing said Auger electrons, said electron gun having an electron gun axis extended to said surface, an electron beam source for generating said electron beam along said electron gun axis, and an electron lens system between said electron beam source and said surface for guiding said electron beam towards said surface along said electron gun axis, the improvement wherein said electron lens system comprises:

controllable electrostatic lens means adjacent to said electron beam source for controllably focusing said electron beam into a controllably processed beam; and a permanent magnet member nearer to said surface than said electrostatic lens means for generating a magnetic field to focus said processed beam onto said surface.

2. An Auger electron spectrometer as claimed in claim 1, said electron spectroscope being a cylindrical mirror type analyzer which comprises an inner cylindrical electrode member defining an inner cylindrical space and an outer cylindrical electrode member surrounding said inner cylindrical space with an intermediate space left between said inner and said outer cylindrical electrode members, wherein said electron gun is disposed in said inner cylindrical space.

3. An Auger electron spectrometer as claimed in claim 1, wherein said permanent magnet member comprises a plurality of permanent magnet pieces which are radially spaced apart from said electron gun axis to leave an internal space for said processed beam and are azimuthally spaced apart from one another to leave a plurality of azimuthal spaces for said Auger electrons, each of said permanent magnet pieces having a magnetic axis parallel to said electron gun axis.

4. An Auger electron spectrometer as claimed in claim 1, said spectrometer comprising an ion gun for radiating an ion beam onto said surface along an ion gun axis which is oblique to said electron gun axis and substantially concurrent with said electron gun axis on said surface, wherein said permanent magnet member comprises a permanent magnet element having an internal wall surrounding an internal space for said processed beam and for said ion beam.

5. An Auger electron spectrometer as claimed in claim 1, wherein said permanent magnet member comprises:

a permanent magnet element which has an inner surface surrounding an internal space of a predetermined shape, an outer surface opposite to said inner surface, a first end surface between said inner and said outer surfaces and directed towards said electrostatic lens means, and a second end surface opposite to said first end surface and between said inner and said outer surfaces;

a first magnetic pole piece having a first opening formed therethrough and brought into contact with said first end surface with said first opening in communication with said internal space; and a second magnetic pole piece having a second opening formed therethrough and brought into contact with said second end surface with said second opening in communication with said internal space; said internal space and said first and said second openings being for passage therethrough of said processed beam.

6. An Auger electron spectrometer as claimed in claim 5, wherein said permanent magnet member further comprises:
a ring-shaped electrode placed in said internal space between said first and said second magnetic pole pieces for generating an electric field to control said magnetic field.

7. An Auger electron spectrometer as claimed in claim 5, wherein said predetermined shape is frustoconical and having a wider and a narrower area along said first and second magnetic pole pieces, respectively.

8. An Auger electron spectrometer as claimed in claim 5, wherein said permanent magnet member further comprises:
means connected to said first and said second magnetic pole pieces for bypassing said first and said second magnetic pole pieces to control the magnetic field generated by a combination of said permanent magnet element and said first and said second magnetic pole pieces.

9. An Auger electron spectrometer as claimed in claim 5, wherein said permanent magnet member further comprises:
a stacked layer on said outer surface, said stacked layer comprising a combination of a nonmagnetic film and a magnetic·film.

10. An Auger electron spectrometer as claimed in claim 1, wherein said electrostatic lens means comprises:
a first electrostatic lens adjacent to said electron beam source for preliminarily focusing said electron beam to allow the electron beam to pass therethrough along said electron gun axis; and
a second electrostatic lens further from said electron beam source than said first electrostatic lens for additionally focusing the electron beam to produce said processed beam towards said permanent magnet member.

11. An Auger electron spectrometer as claimed in claim 10, further comprising an aperture stop between said first and said second electrostatic lenses.

* * * * *